March 26, 1968 D. DAWSON 3,375,469
FREQUENCY MODULATED ELECTRIC OSCILLATORS UTILIZING VARIABLE CAPACITANCE SEMICONDUCTOR DIODES
Filed Nov. 8, 1966
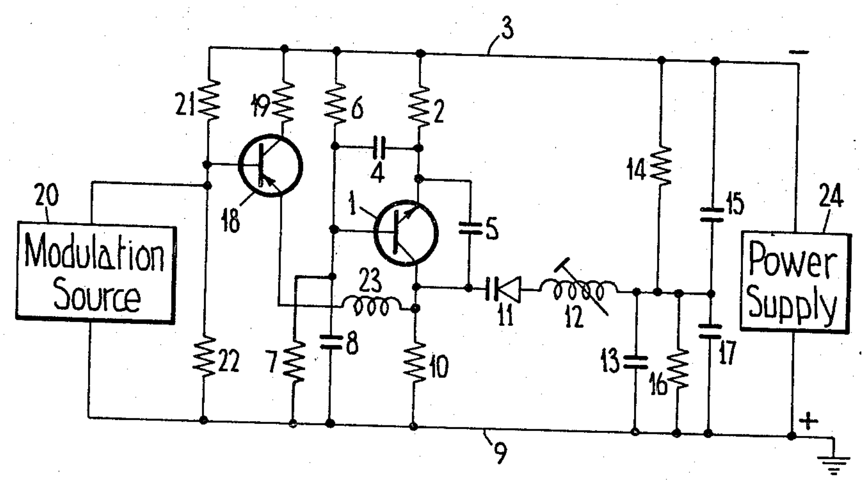
INVENTOR
David Dawson
BY
Kurchtein, Kirchtein & Ottinger
ATTORNEYS United States Patent Office 3,375,469

Patented Mar. 26, 1968

3,375,469

FREQUENCY MODULATED ELECTRIC OSCILLATORS UTILIZING VARIABLE CAPACITANCE SEMICONDUCTOR DIODES

David Dawson, Coventry, England, assignor to The General Electric Company Limited, London, England, a British company A variable frequency electric oscillator in accordance with the present invention will now be described by way of example with reference to the accompanying drawing, which shows the oscillator diagrammatically.

The oscillator comprises an n-p-n junction transistor 1, the emitter electrode of which is connected by way of a resistor 2 to a negative supply line 3, by way of a capaci- In the example quoted above component values were as follows:

| | | |
|---|---|---|
| Resistor 2 | ohms | 620 |
| Resistor 6 | kilohms | 3.9 |
| Resistor 7 | do | 12 |
| Resistor 10 | ohms | 620 |
| Capacitor 4 | picofarads | 47 |
| Capacitor 5 | do | 22 |
| Capacitor 8 | do | 1000 |
| Capacitor 13 | do | 1000 |
| Inductor 12 | microhenrys | 0.8 |
| Transistor 1 type (Ferranti) | | ZT 2708 |
| Diode 11 type (Fijitsu) | | 1S 518 |

I claim:

1. A frequency modulated electric oscillator comprising a transistor, a series tuned circuit comprising in order, a variable capacitance semiconductor diode, an inductor and a capacitor of large value compared with the value of capacitance of the variable capacitance diode, power supply means, means connecting said series tuned circuit between the collector electrode of said transistor and one pole of said power supply means such that said collector electrode is connected to one terminal of said variable capacitance diode, means connecting said transistor to the other pole of said power supply means for energization of the transistor, capacitive feedback means connected between the collector and emitter electrodes of said transistor, means to apply a substantially constant voltage across said capacitor of large value, a modulation source, and means to apply a frequency modulating signal voltage from said source to the junction between the collector electrode of said transistor and said variable capacitance diode.

2. A frequency modulated electric oscillator in accordance with claim 1 wherein the means to apply the frequency modulating signal voltage from the source comprises a further transistor of opposite conductivity type to the first mentioned transistor, and means connecting said further transistor for energization from said power supply means as a buffer amplifier, said last mentioned means including a connection between the emitter electrode of said further transistor and the junction between the collector electrode of the first mentioned transistor and the variable capacitance diode.

References Cited

UNITED STATES PATENTS

| | | | |
|---|---|---|---|
| 2,984,794 | 5/1961 | Carter et al. | 331—117 |
| 3,249,897 | 5/1966 | Trilling. | |
| 3,302,138 | 1/1967 | Brown et al. | 331—116 |

OTHER REFERENCES

Electronic Industries, August 1965, p. 168.

JOHN KOMINSKI, *Primary Examiner.*